(12) United States Patent
Chang et al.

(10) Patent No.: US 6,284,621 B1
(45) Date of Patent: Sep. 4, 2001

(54) SEMICONDUCTOR STRUCTURE WITH A DIELECTRIC LAYER AND ITS PRODUCING METHOD

(75) Inventors: Kow-Ming Chang, Hsinchu; Ji-Yi Yang, Taoyuan, both of (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/239,000

(22) Filed: Jan. 27, 1999

(30) Foreign Application Priority Data

Sep. 23, 1998 (TW) ................................................ 87115851

(51) Int. Cl.$^7$ .................................................. H01L 21/764
(52) U.S. Cl. ........................... 438/422; 438/411; 438/619
(58) Field of Search .............................. 438/411, 421–22, 438/15, 50, 51, 778, 780, 781, 782, 763, 619, 622; 257/522

(56) References Cited

U.S. PATENT DOCUMENTS

| | | | |
|---|---|---|---|
| 5,814,888 | * 9/1998 | Nishioka et al. | 257/758 |
| 5,863,832 | * 1/1999 | Doyle et al. | 438/622 |
| 5,880,018 | * 3/1999 | Boeck et al. | 438/619 |
| 5,949,143 | * 9/1999 | Bang | 257/758 |
| 5,989,983 | * 11/1999 | Goo et al. | 438/473 |
| 6,071,805 | * 6/2000 | Liu | 438/619 |
| 6,130,151 | * 10/2000 | Lin et al. | 438/619 |

* cited by examiner

Primary Examiner—Olik Chaudhuri
Assistant Examiner—Anh Duy Mai
(74) Attorney, Agent, or Firm—Alston & Bird LLP

(57) ABSTRACT

A semiconductor structure with a dielectric layer and its producing method are disclosed. The semiconductor structure includes a semiconductor substrate having thereon a plurality of metal lines and there are a plurality of concave regions formed between the metal lines. The dielectric layer is formed on the semiconductor by a method which can prevent the dielectric material from flowing into the concave regions. The method includes the steps of (a) providing a semiconductor substrate having thereon a plurality of metal lines forming therebetween a plurality of concave regions; and (b) forming the dielectric layer on the metal lines. The concave regions are only filled with air so that the capacitance of the semiconductor is lowered.

15 Claims, 8 Drawing Sheets

(a)

(b)

(a)

(b)

SEMICONDUCTOR STRUCTURE WITH A DIELECTRIC LAYER AND ITS PRODUCING METHOD

FIELD OF THE INVENTION

The present invention relates to a method for forming a dielectric layer and a semiconductor structure with a dielectric layer.

BACKGROUND OF THE INVENTION

In order to save more data in a limited space of the integrated circuit, the line width is getting smaller and smaller. Currently, the minimum line width is 0.35 μm or 0.25 μm. In the future, the line width may be minimized to 0.18 μm. The smaller the line width, the smaller the space between the metal lines becomes. However, the capacitance between the metals lines will be increased if the space is getting smaller. The large capacitance will decrease the working speed and working efficiency.

The solution of this problem is to develop a new material with a very low dielectric constant. The dielectric material generally used in the case of fabricating the line width of 0.35 μm is $SiO_2$ and SiOF and the dielectic constant of them is in the range of 3~3.7. The polymer/aerogels/air material with a dielectric constant ranged from 1 to 2 is a new dielectric material used in the case of fabricating the line width of 0.25 μm. However, the best dielectric material is air. The dielectric constant of air is almost equal to 1, the minimum dielectric constant. If air is used as the dielectric material, the capacitance between the metal lines can be seriously decreased.

The conventional process for producing a dielectric layer is a spinning spread method as shown in FIG. 1. The present invention provides a method of using air as the inter-metal-dielectric (IMD) material and the semiconductor structure with a dielectric layer can be achieved by this method.

SUMMARY OF THE INVENTION

An object of the present invention is to provide a method for forming a dielectric layer. The method includes the steps of (a) providing a semiconductor substrate having thereon a plurality of metal lines forming therebetween a plurality of concave regions, and (b) forming the dielectric layer on the metal lines while preventing the dielectric layer from being formed inside the concave regions. The dielectric layer is an inter-metal-dielectric (IMD) layer and preferably the dielectric material is air. The concave regions are formed by the spaces between the metal lines, and each of the concave regions sometimes further includes a plurality of smaller concave regions between the metal lines.

The step (b) of the present invention further includes four steps of the viscosity-adjusting method, the tilt-flowing method, the mold-forming method, and the mold-flowing method.

The viscosity-adjusting method of the step (b) includes the steps of (b1) dropping a liquid dielectric material on the semiconductor substrate to form the dielectric layer. The surface tension of the liquid dielectric material is controlled by adding therein an adjusting agent for preventing the liquid dielectric material from flowing into the concave regions. The liquid dielectric material is preferably hydrogen silsesquioxane (HSQ). After the step (b), the method further includes a step of (c1) drying the dielectric layer.

The tilt-flowing method of the step (b) includes the steps of (b2) tilting the semiconductor substrate with a particular angle, and (b3) dropping a liquid dielectric material on the semiconductor substrate to form the dielectric layer. The surface tension of the liquid dielectric material is also controlled by adding therein an adjusting agent and the liquid dielectric material is HSQ. The particular angle is preferably 90 degrees. After the step (b), the tilt-flowing method further includes a step of (c2) drying the dielectric layer.

The mold-forming method of the step (b) includes the steps of (b4) covering the top of a molding board with a liquid dielectric material, and (b5) putting the molding board upside-down on the semiconductor substrate to form the dielectric layer on the metal lines. After the step (b4), the method further includes the steps of (c3) drying the dielectric layer, and (c4) removing the molding board. In order to facilitate the step (c4), the molding board has thereon a polymer film, and preferably the polymer material is polyimide.

The mold-flowing method of the step (b) further includes the steps of (b6) tilting the semiconductor substrate with a particular angle, (b7) tilting a molding board with the particular angle, wherein the metal lines substrate and the molding board have a gap therebetween, and (b8) dropping a liquid dielectric material in the gap to form the dielectric layer. After the step (b), the mold-forming method further includes the steps of (c5) drying the dielectric layer, and (c6) removing the molding board. In order to facilitate the step (c6), the molding board has thereon a polymer film, and preferably the polymer material is polyimide. The particular angle of the mold-forming method is ranged from 0 to 180 degrees.

Another object of the present invention is to provide a semiconductor structure including a semiconductor substrate having thereon a plurality of metal lines forming therebetween a plurality of concave regions, and a dielectric layer formed on the metal lines excepting the concave regions.

The present invention may best be understood through the following description with reference to the accompanying drawings, in which:

DETAILED DESCRIPTION OF THE PREFERRED EMBODIMENTS

Figure 1:
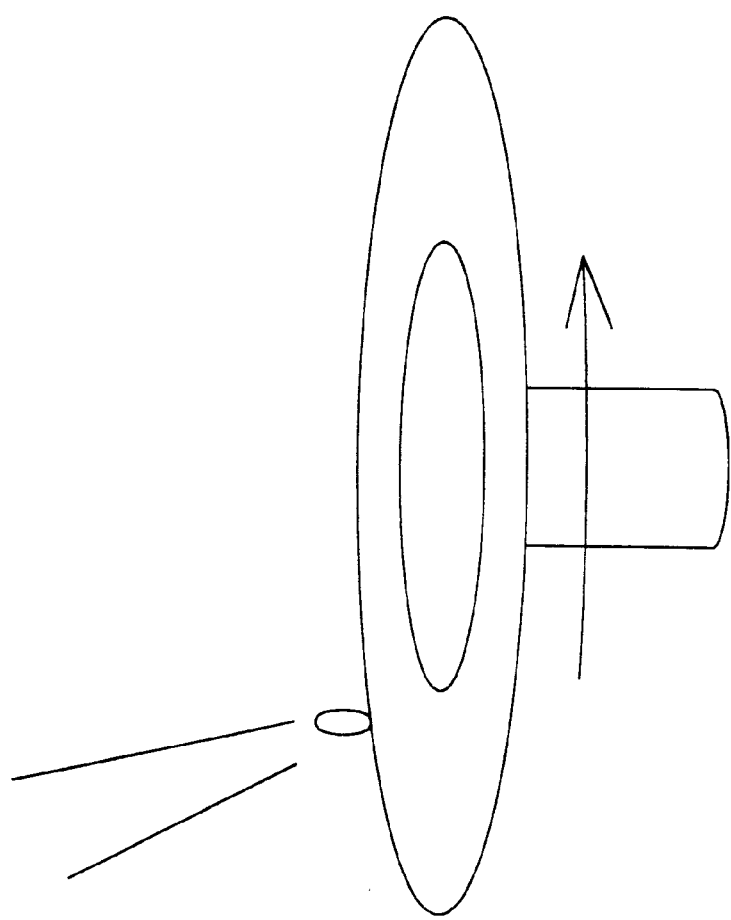
FIG. 1 schematically shows a conventionally spinning spread method.
Figure 2:
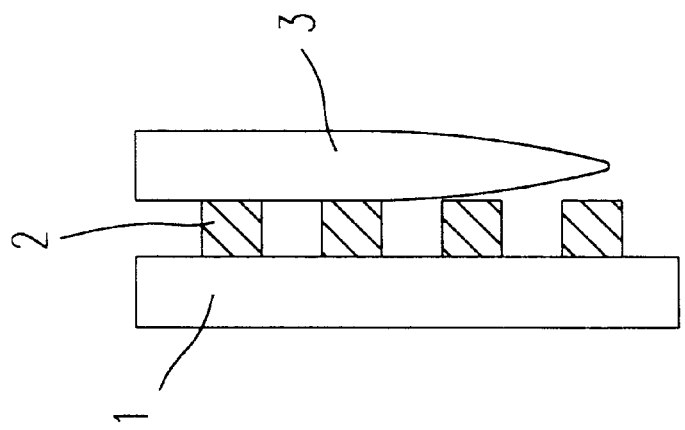
FIG. 2 schematically shows a preferred embodiment of the method according to the present invention.
Figure 2:
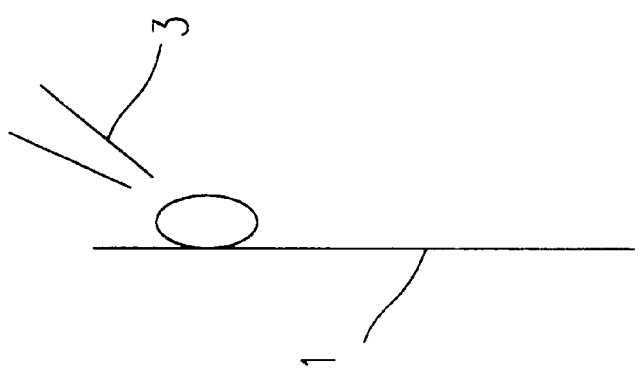

The present invention provide an easy method for using air as the dielectric filler. Please refer to FIG. 2 showing a preferred embodiment of the present invention. From the macroscopic view, as shown in FIG. 2(a), the dielectric material of the present invention is a liquid dielectric material 3 dropped on the semiconductor substrate 1 to form the dielectric layer 3. The semiconductor substrate 1 has thereon a plurality of metal lines 2 forming therebetween a plurality of concave regions. After the dielectric layer is formed, the method further comprises a step of drying the dielectric layer. The surface tension of the liquid dielectric material is controlled by adding therein an adjusting agent for preventing the liquid dielectric material from flowing into the concave regions. If the viscosity, surface tension, and contact angle of the liquid dielectric material and the width of the concave regions are carefully controlled, no liquid dielectric material will flow into the concave regions as shown in FIG. 2(b). This is called the viscosity-adjusting method. Therefore, the concave regions will be filled with air to decrease the capacitance between the metal lines. The dielectric layer is an inter-metal-dielectric (IMD) layer. The liquid dielectric material is preferably hydrogen silsesquioxane (HSQ), and the each of the concave regions further includes a plurality of smaller concave regions between the metal lines.

If the liquid dielectric material is dropped on a semiconductor substrate which has been tilted at a particular angle, the viscosity-adjusting method can be called the tilt-flowing method. The particular angle is ranged from 0 to 180 degrees, preferably 90 degrees. By tilting the semiconductor substrate at a particular angle, the gravity will help the liquid dielectric material to flow so that the time for forming the dielectric layer can be saved.

Figure 3:
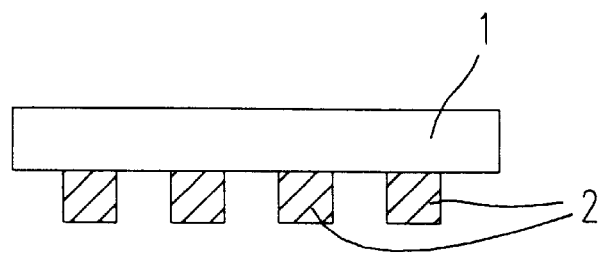
FIG. 3 schematically shows another preferred embodiment of the method according to the present invention.
Figure 3:
Figure 3:
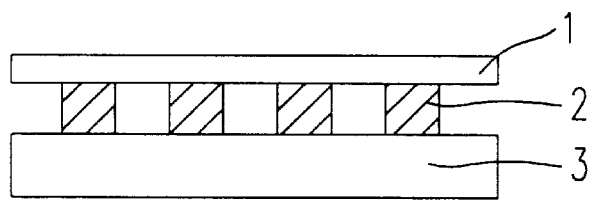

Another preferred embodiment of the present invention is shown in FIG. 3. The difference between the above-described viscosity-adjusting method and tilt-flowing method is that the dielectric layer 3 is formed on a molding board 5 at first in the tilt-flowing method. After the dielectric layer 3 is formed on the molding board 5, the molding board 5 is put upside down on the semiconductor substrate. Then, by drying the dielectric layer 3, the molding board 5 can be removed. The molding board 5 can also have a polymer film 4 for advantageously removing the molding board 5. The polymer material of the film 4 is preferably polyimide. This method for forming a dielectric layer is called the mold-forming method.

Figure 4:
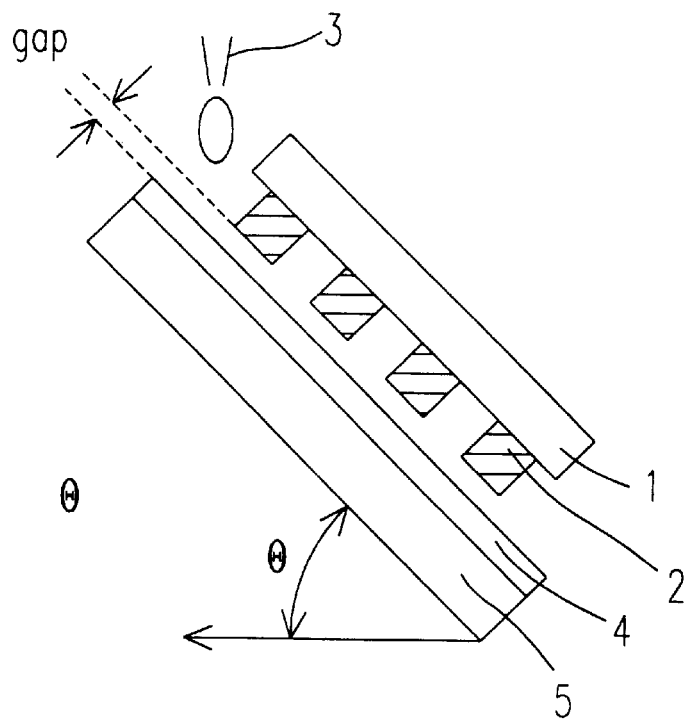
FIG. 4 schematically shows a further preferred embodiment of the method according to the present invention.
Figure 4:
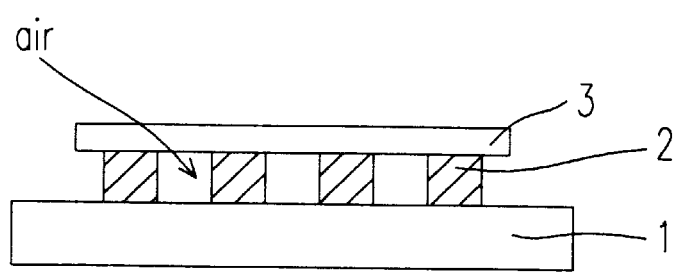

A further preferred embodiment of the present invention is shown in FIG. 4. This is called the mold-flowing method. The semiconductor substrate 1 having thereon a plurality of metal lines 2 and the molding board 5 are both tilted at a particular angle and there is a particular gap between the metal lines 2 and the molding board 5. The width of the gap has to be based on the viscosity of the liquid dielectric material 3. Then, the liquid dielectric material 3 is dropped into the gap to form the dielectric layer 3. After the dielectric layer 3 is dried, the molding board 5 can be removed. Of course, a polyimide film 4 can also be on the molding board 5 for removing the molding board 5. The particular angle of the mold-flowing method is ranged from 0 to 180 degrees, preferably 45 degrees.

Figure 5:
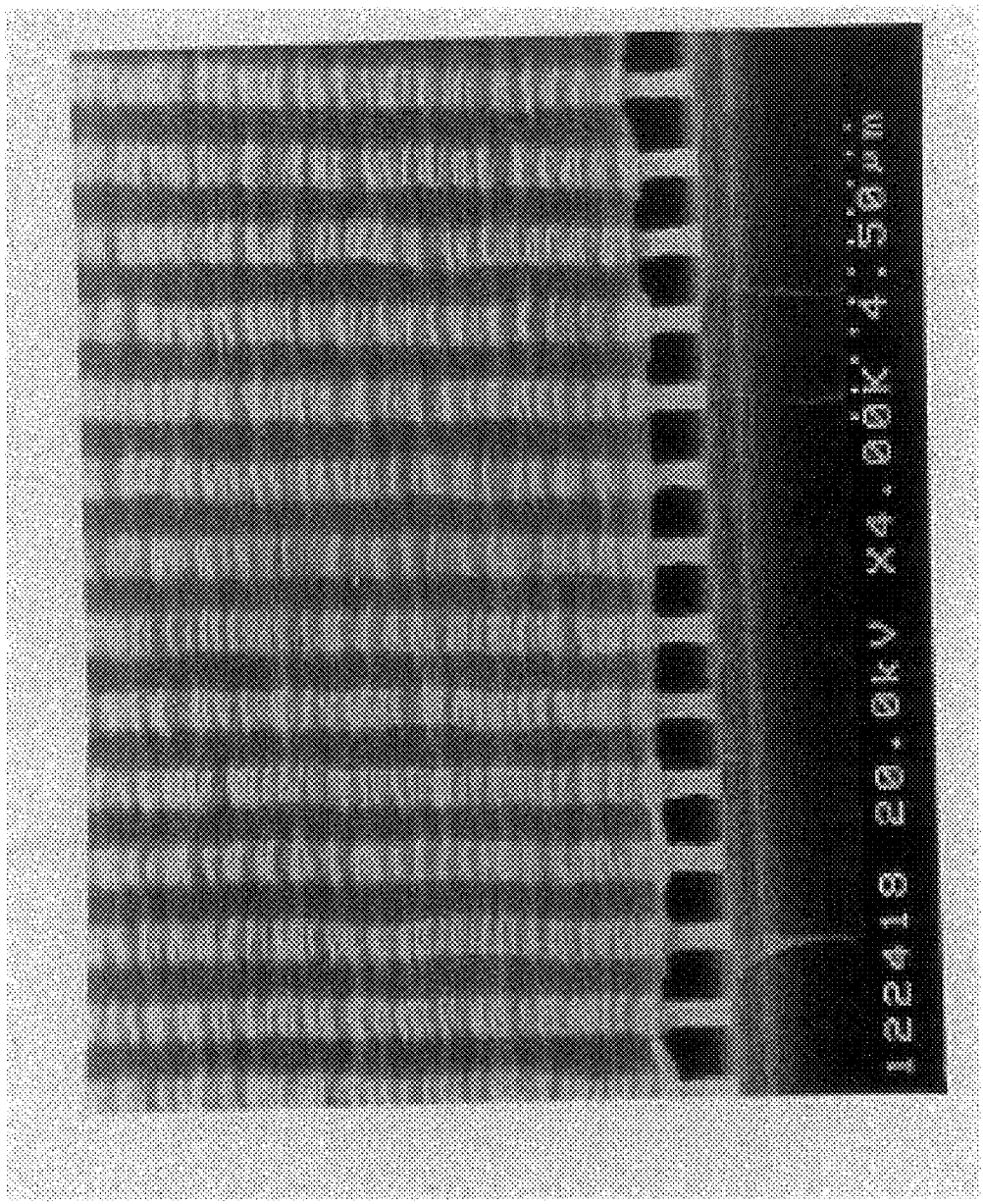
FIG. 5 is a sectional view of the dielectric layer according to the present invention.

FIG. 5 is a sectional view of the dielectric layer according to the present invention. This sectional view is taken by a scanning electron microscope (SEM) after the dielectric layer is cured at 400° C. The dielectric layer in FIG. 5 is only several hundred angstroms and the concave regions is filled with air. This is a proof of the practicability of the present invention.

Figure 6:
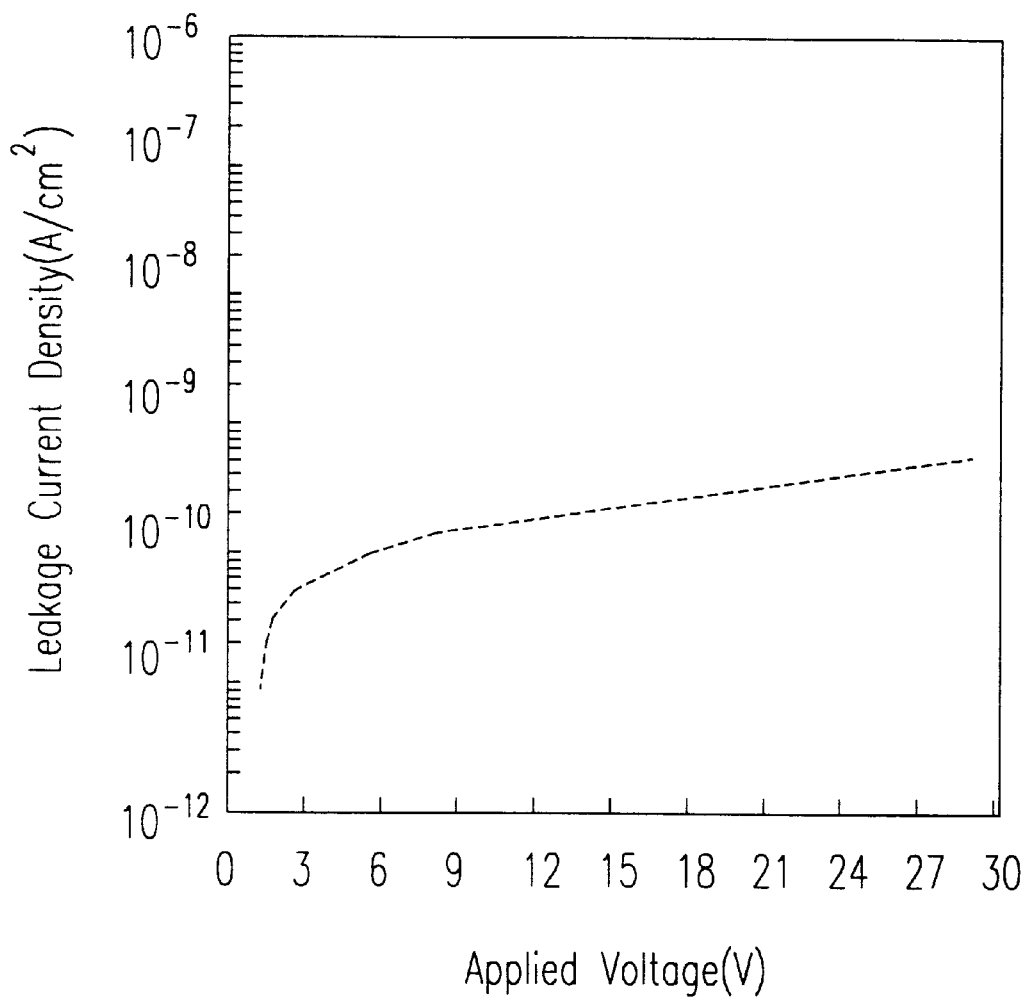
FIG. 6 illustrates a wire-to-wire isolation characteristic of the dielectric layer according to the present invention.
Figure 7:
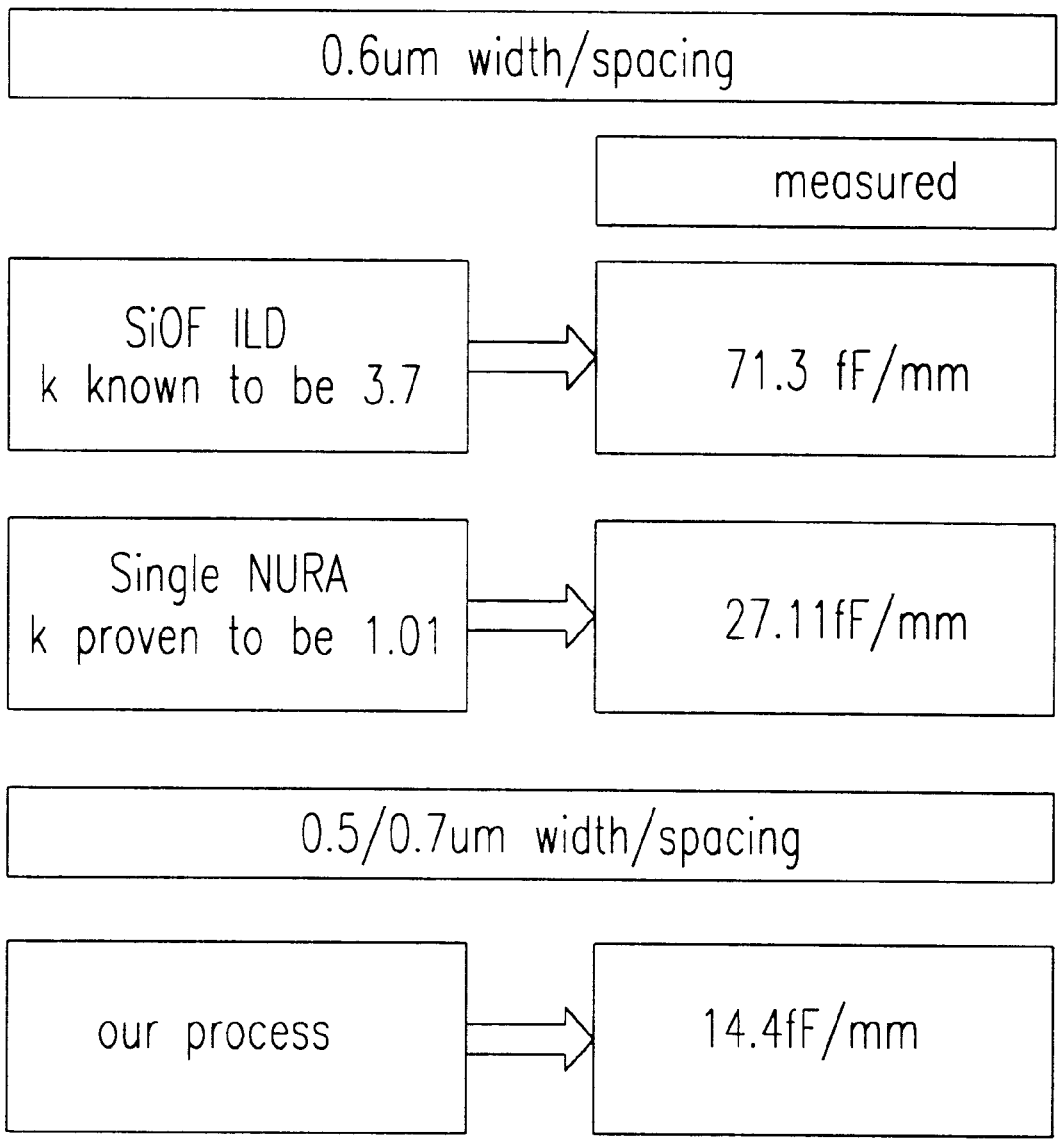
FIG. 7 shows the wire-to wire capacitance of the present invention which is different from that of the conventional method.
Figure 8:
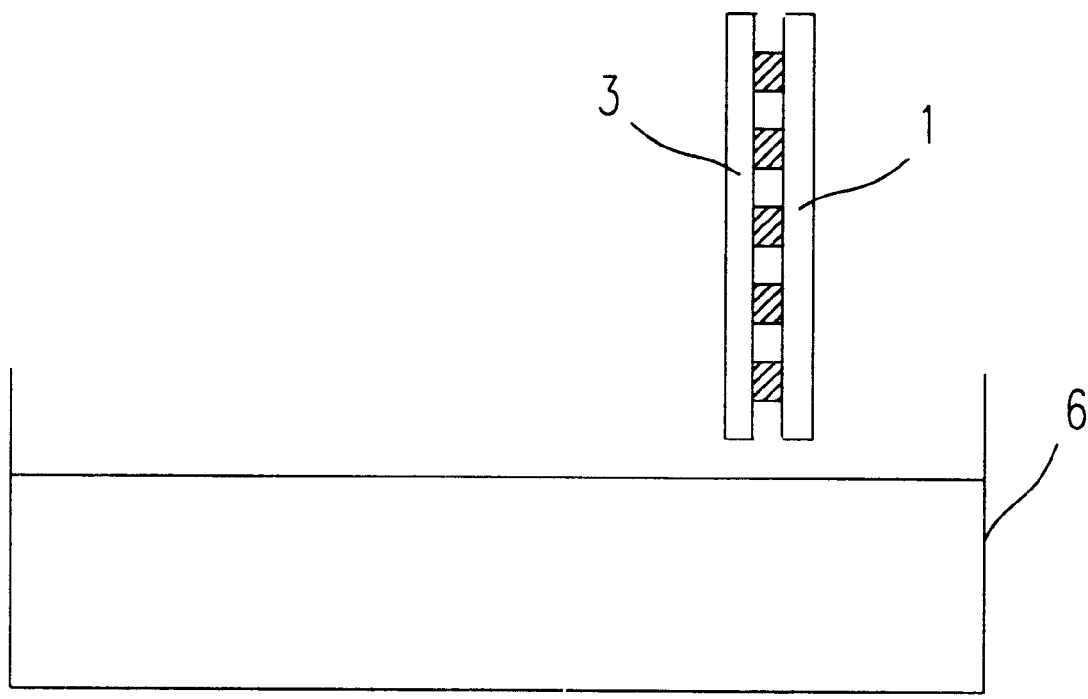
FIG. 8 schematically shows an operating method of the present invention.

The wire-to-wire isolation characteristic of the dielectric layer according to the present invention is shown in FIG. 6. While the applied voltage is increased, the increasing rate of the leakage current density is very slow. The wire-to wire capacitance of the present invention is compared with that of the conventional method, as shown in FIG. 7. The capacitance of the present invention is 14.4 fF/mm when the width of the metal line and of the gap are 0.5 $\mu$m and 0.7 $\mu$m respectively. This value is obviously lower than the capacitance of the semiconductor made by he conventional method. FIG. 8 schematically shows an operating method of the present invention. There is a vessel 6 below the semiconductor substrate 1. The excess liquid dielectric material 3 on the semiconductor substrate 1 can be collected by the vessel 6 to be reused.

The method of the present invention is a easy method for fabricating a semiconductor structure with a dielectric layer. The space between the metal lines of the present invention is filled with air and the dielectric constant is lowered almost to 1. The capacitance of the present invention is effectively lowered with incurring large expanses typically associated with equipment upgrade.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for forming a dielectric layer comprising steps of:
   providing a semiconductor substrate having thereon a plurality of metal lines forming therebetween a plurality of concave regions;
   covering the top of a molding board with a liquid dielectric material; and
   putting said molding board upside down on said semiconductor substrate to form said dielectric layer on said metal lines.

2. The method according to claim 1, further comprising steps of:
   drying said dielectric layer; and
   removing said molding board.

3. The method according to claim 2, wherein said molding board has a polymer film for facilitating said step of removing said molding board.

4. The method according to claim 3, wherein said polymer film is a polyimide film.

5. The method according to claim 1, wherein said liquid dielectric material is HSQ.

6. A method for forming a dielectric layer comprising steps of:
   providing a semiconductor substrate having thereon a plurality of metal line forming therebetween a plurality of concave regions;
   tilting said semiconductor substrate at a particular angle, wherein said particular angle is 90 degrees angle; and
   dropping a liquid dielectric material on said semiconductor substrate to form said dielectric layer on said metal lines while preventing said dielectric layer from being formed inside said concave regions.

7. The method according to claim 1, wherein the surface tension of said liquid dielectric material is controlled by adding therein an adjusting agent for preventing said liquid dielectric material from flowing into said concave regions.

8. The method according to claim 1, wherein said liquid dielectric material is HSQ.

9. The method according to claim 1, further comprising a step of drying said dielectric layer.

10. A method for forming a dielectric layer comprising steps of:

providing a semiconductor substrate having thereon a plurality of metal lines forming therebetween a plurality of concave regions;

tilting said semiconductor substrate at a particular angle;

tilting a molding board at said particular angle, said metal lines and said molding board having a gap therebetween; and dropping a liquid dielectric material in said gap to form said dielectric layer.

11. The method according to claim 10, further comprising steps of:

drying said dielectric layer; and removing said molding board.

12. The method according to claim 11, wherein said molding board has a polymer film thereon for facilitating said step of removing said molding board.

13. The method according to claim 12, wherein said polymer film is a polyimide film.

14. The method according to claim 10, wherein said particular angle is ranged from 0 to 180 degrees.

15. The method according to claim 10, wherein said liquid dielectric material is HSQ.

* * * * *

UNITED STATES PATENT AND TRADEMARK OFFICE
CERTIFICATE OF CORRECTION

PATENT NO.   : 6,284,621 B1  
DATED        : September 4, 2001  
INVENTOR(S)  : Chang et al.

It is certified that error appears in the above-identified patent and that said Letters Patent is hereby corrected as shown below:

Column 4,
Line 59, "degrees" cancel "angle";
Line 64, "claim 1" should read -- claim 6 --.

Column 5,
Line 1, "claim 1" should read -- claim 6 --;
Line 3, "claim 1" should read -- claim 6 --.

Signed and Sealed this

Thirtieth Day of April, 2002

Attest:

Attesting Officer

JAMES E. ROGAN
Director of the United States Patent and Trademark Office